United States Patent
Honma et al.

(10) Patent No.: US 7,505,315 B2
(45) Date of Patent: Mar. 17, 2009

(54) NONVOLATILE SEMICONDUCTOR STORAGE APPARATUS

(75) Inventors: Mitsuaki Honma, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/850,252

(22) Filed: Sep. 5, 2007

(65) Prior Publication Data

US 2008/0062758 A1 Mar. 13, 2008

(30) Foreign Application Priority Data

Sep. 8, 2006 (JP) ............................. 2006-244595

(51) Int. Cl.
*G11C 16/04* (2006.01)
(52) U.S. Cl. ........................... 365/185.03; 365/185.12; 365/185.17; 365/185.18; 365/185.25
(58) Field of Classification Search ............ 365/185.03, 365/185.12, 185.17, 185.18, 185.25
See application file for complete search history.

(56) References Cited

U.S. PATENT DOCUMENTS 7,372,730 B2 * 5/2008 Chen ..................... 365/185.02

2008/0112221 A1 * 5/2008 Park et al. .............. 365/185.03

FOREIGN PATENT DOCUMENTS

JP 2000-195280 7/2000

* cited by examiner

*Primary Examiner*—Connie C Yoha
(74) *Attorney, Agent, or Firm*—Oblon, Spivak, McClelland, Maier & Neustadt, P.C.

(57) ABSTRACT

A nonvolatile semiconductor storage apparatus comprises a memory cell array having a plurality of memory cells which are connected to word lines and to bit lines and in each of which different information of x (x is an integer equal to or larger than 3) bits is stored in association with $2^x$ threshold voltages, the x-bit information being able to be read from each memory cell by applying a read voltage to the corresponding word line; a row decoder connected to the word lines to supply voltages to the word lines to operate the memory cells; and a sense amplifier device connected to the bit lines to read data stored in the memory cells and to hold the read data and data written to the memory cells, wherein the x-bit information corresponding to a certain threshold voltage differs from that corresponding to the adjacent threshold voltage by only 1 bit, $2^x-1$ of the read voltages are each set for a pair of adjacent threshold voltages, and applying any of the read voltages to the word line determines the x-bit information stored in the memory cell, and at least two read voltages are set in order to determine information for each of the x bits.

10 Claims, 9 Drawing Sheets

NONVOLATILE SEMICONDUCTOR STORAGE APPARATUS

CROSS-REFERENCE TO RELATED APPLICATION

This application is based upon and claims the benefit of priority from the prior Japanese Patent Application No. 2006-244595, filed on Sep. 8, 2006, the entire contents of which are incorporated herein by reference.

BACKGROUND OF THE INVENTION

1. Field of the Invention

The present invention relates to a nonvolatile semiconductor storage apparatus including memory cells each having a plurality of thresholds.

2. Background Art

Recent nonvolatile semiconductor storage apparatuses use a multivalued technique for providing each memory cell with a plurality of threshold states to allow the memory cell to store plural bits of information, increasing the capacity of the memory cell (see, for example, Japanese Patent Laid-Open No. 2000-195280). This technique has reduced the difference between adjacent thresholds.

Thus, a defect in the memory cell or an excessive applied write voltage may cause the thresholds for the memory cell to be erroneously written to positions different from the desired ones. This is likely to cause erroneous write operations.

In particular, a threshold voltage adjacent to the correct one is frequently erroneously written to the memory cell. An external error correction circuit is thus introduced to correct erroneously written threshold voltage during a read operation. However, a variation in error rate among pages may hinder errors from being efficiently corrected. Thus, desirably, the fraction defectives of the respective pages are made as uniform as possible.

Further, with a conventional read procedure, the multivalued memory cell significantly varies the time required to read each of plural bits. This may affect the amount of time before data can be output. Accordingly, the read time needs to be averaged.

SUMMARY OF THE INVENTION

According one aspect of the present invention, there is provided: a nonvolatile semiconductor storage apparatus comprising a memory cell array having a plurality of memory cells which are connected to word lines and to bit lines and in each of which different information of x (x is an integer equal to or larger than 3) bits is stored in association with $2^x$ threshold voltages, the x-bit information being able to be read from each memory cell by applying a read voltage to the corresponding word line;

a row decoder connected to the word lines to supply voltages to the word lines to operate the memory cells; and a sense amplifier device connected to the bit lines to read data stored in the memory cells and to hold the read data and data written to the memory cells, wherein the x-bit information corresponding to a certain threshold voltage differs from that corresponding to the adjacent threshold voltage by only 1 bit, $2^x-1$ of the read voltages are each set for a pair of adjacent threshold voltages, and applying any of the read voltages to the word line determines the x-bit information stored in the memory cell, and at least two read voltages are set in order to determine information for each of the x bits.

DETAILED DESCRIPTION

Embodiments according to the present invention will be described below with reference to the drawings. In the embodiments below, the description of application of the present invention to a NAND type flash memory is also applicable to a NOR type flash memory.

Figure 1:
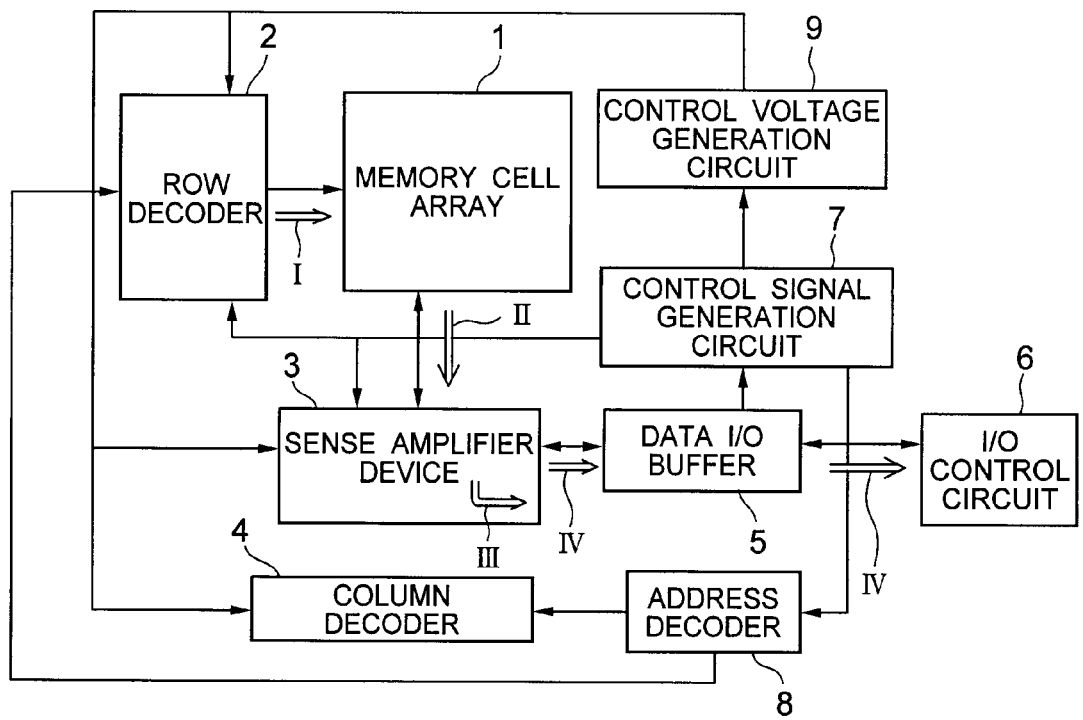
FIG. 1 is a block diagram showing an essential part of a nonvolatile semiconductor storage apparatus 100 according to Embodiment 1 that is an aspect of the present invention.
Figure 2:
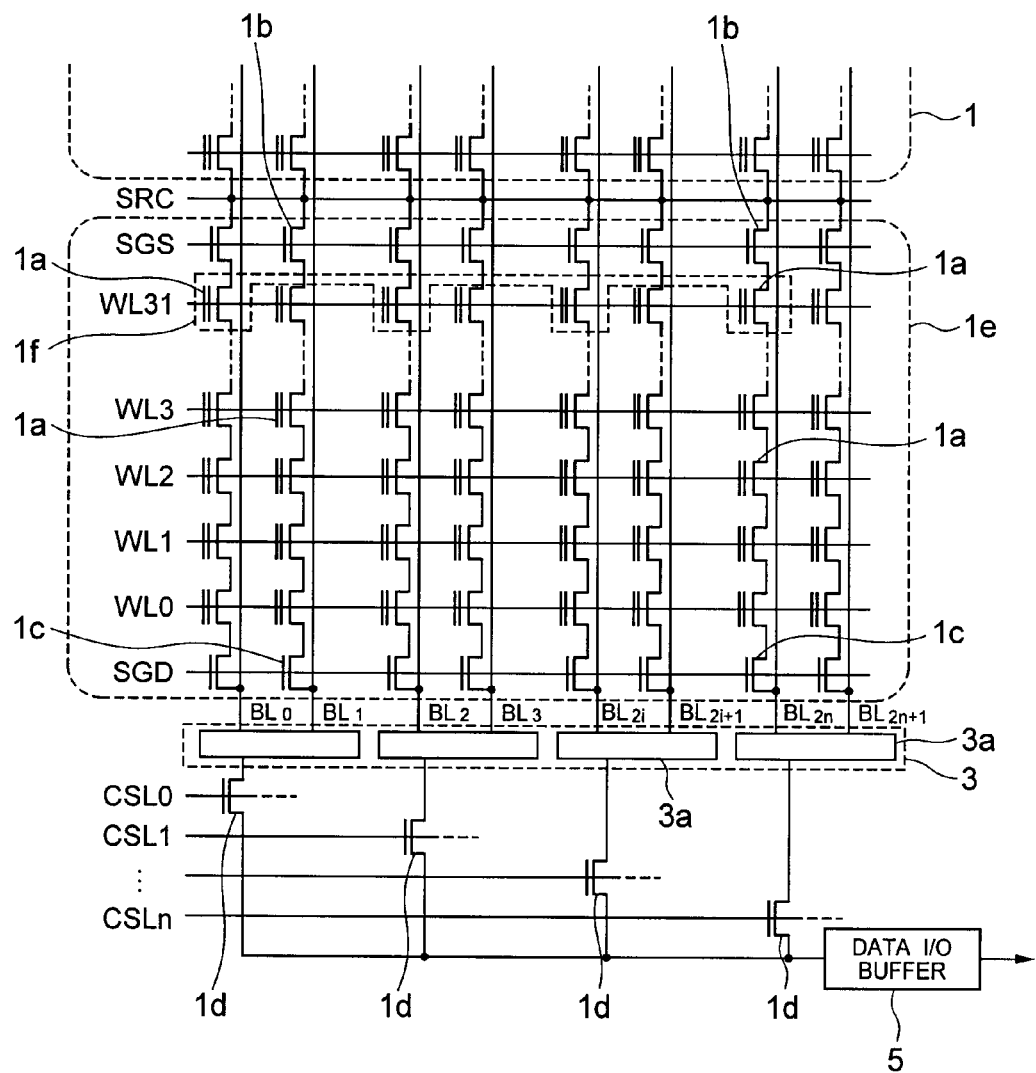
FIG. 2 is a circuit diagram showing the configuration of an essential part of a memory cell array 1 in FIG. 1.

FIG. 1 is a block diagram showing an essential part of a nonvolatile semiconductor storage apparatus 100 according to Embodiment 1 that is an aspect of the present invention. FIG. 2 is a circuit diagram showing the configuration of an essential part of a memory cell array 1 in FIG. 1.

As shown in FIG. 1, the nonvolatile semiconductor storage apparatus 100 includes a memory cell array 1, a row decoder 2, a sense amplifier device 3, a column decoder 4, a data I/O buffer 5, an I/O control circuit 6, a control signal generation circuit 7, an address decoder 8, and a control voltage generation circuit 9.

The row decoder 2 is connected to word lines. The row decoder 2 includes a word line driving circuit (not shown) to select and drive any of the word lines in the memory cell array 1.

The sense amplifier device 3 is connected to bit lines from the memory cell array 1 to read data stored in memory cells and to hold read data and data written to memory cells.

The column decoder 4 selects a bit line from the memory cell array 1.

During a data read operation, data read to the sense amplifier device 3 is output to the I/O control circuit 6 via the data I/O buffer 5.

The I/O control circuit 6 supplies a command to the control signal generation circuit 7 via the data I/O buffer 5. The control signal generation circuit 7 decodes the command.

The control signal generation circuit 7 is supplied with external control signals such as a chip enable signal CE, a write enable signal WE, a read enable signal RE, an address latch enable signal ALE, and a command latch enable signal CLE.

The control signal generation circuit 7 controls a data write sequence, a data erasure sequence, and a data read operation on the basis of external control signals and commands supplied in accordance with an operation mode.

When the control signal generation circuit 7 outputs signals that control various operations such as a read operation, a write operation, and an erasure operation, the control voltage generation circuit 9 generates voltages for these operations.

The address of a memory cell is supplied by the I/O control circuit 6 via the data I/O buffer 5. The address is transferred to the word line control circuit 2 and the column decoder 4 via the address decoder 8.

As shown in FIG. 2, the memory cell array 1 has a plurality of memory cells (NAND cells) 1a arranged in a matrix. The memory cells (NAND cells) 1a are connected to word lines WL1 to WL31 in a select row direction and to bit lines BL0 to BL2n+1 (n is an integer equal to or larger than 0) in a select column direction.

The memory cell 1a stores information of different x bits (x is an integer equal to or larger than 2) corresponding to $2^x$ threshold voltages. Applying a read voltage to any of the word lines WL1 to WL31 enables x-bit information from each of the corresponding memory cells 1a. That is, the memory cell 1a is multivalued.

The memory cell array 1 has select gate transistors 1b that connects a source line SRC to the corresponding memory cells 1a. Each of the select gate transistors 1b has a gate to which a source side select gate line SGS is connected. The select gate transistor 1b is controlled by a voltage applied to the source side select gate line SGS by the row decoder 2.

The memory cell array 1 has select gate transistors 1c that connects the corresponding bit lines BL0 to BL2n+1 to the corresponding memory cells 1a. Each of the select gate transistors 1c has a gate to which a drain side select gate line SGD is connected. The select gate transistor 1c is controlled by a voltage applied to the drain side select gate line SGD by the row decoder 2.

The memory cells 1a are connected together in series between the source side select gate line SGS and the drain side select gate line SGD.

Write operations and read operations are controlled by voltages applied to the memory cells 1a of each memory cell array 1 and the gates of the select gate transistors 1b and 1c through the word lines WL0 to WL31, connected to the row decoder 2. Thus, the row decoder 2 supplies voltages to the word lines WL0 to WL31 to operate the memory cells.

The sense amplifier device 3 has n sense amplifier circuits 3a. Each of the sense amplifier circuits 3a is connected to the data I/O buffer 5 via the corresponding select gate 1d. The column select gates 1d are controlled by column select signals CSL0 to CSLn. A pair of bit lines (for example, the bit lines BL0 and BL1) is connected to each of the sense amplifier circuit 3a.

The sense amplifier circuit 3a controls the row direction of the memory cell array 1. Specifically, the sense amplifier circuits 3a charge the bit lines BL0 to BL2n+1 to perform write control and read operations.

A block 1e is composed of a plurality of the memory cells 1a arranged between the source side select gate line SGS and the drain side select gate line SGD. Data is erased in terms of these blocks.

A sector 1f is composed of the memory cells 1a connected to the same word line (for example, the word line WL31) and on which a write operation or a read operation is simultaneously performed. The sector 1f stores x pages of data (for example, 3 pages for 3 bits).

Now, description will be given of bit assignment to each threshold voltage for the memory cells in the nonvolatile semiconductor storage apparatus 100 that has the above configuration and performs the above basic operations.

As already described, in the nonvolatile semiconductor storage apparatus 100, information of plural bits is stored in the memory cell 1a on the basis of a difference in threshold voltage. For a read operation, in each sector 1f, a read voltage is applied to a single word line by a similar procedure. All of the n sense amplifier circuits 3a input signals through the bit lines by a similar procedure. The signals are processed by the sense amplifier circuits 3a to read in a set of data for one page at a time along the columns.

Figure 3:
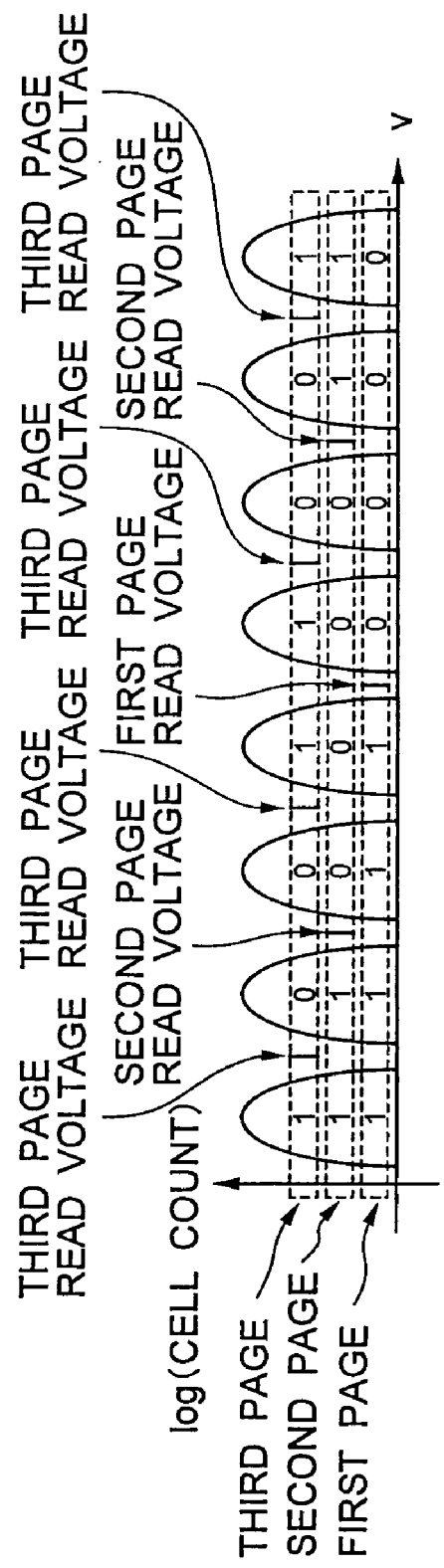
FIG. 3 is a diagram showing a conventional example of bit assignment to each threshold voltage in which each memory cell stores 3-bit information.

FIG. 3 is a diagram showing a conventional example of bit assignment to each threshold voltage in which each memory cell stores 3-bit information.

For example, as shown in FIG. 3, if one cell can hold eight threshold states, 3-bit information can be stored. A first bit address is defined as a first page. A second bit address is defined as a second page. A third bit address is defined as a third page.

The read voltage is set for threshold voltages, containing varying bit information, that is, containing "1" and "0", respectively, which are adjacent to each other. The sense amplifier circuit 3a compares the read voltage with the threshold voltages to obtain bit information "1" and "0".

For the memory cell 1a, plural data assignment methods are possible for information of plural bits stored in an adjacent threshold. In particular, error corrections can be efficiently achieved by an assignment method with which the bit information corresponding to the adjacent threshold voltages always involves only a 1-bit difference. For example, as shown in FIG. 3, if data written to the leftmost distribution garbles into the adjacent data, this data garbling affects only the third page.

Now, description will be given of the relationship between a read voltage application operation during a read operation and a data output operation which are performed by the nonvolatile semiconductor storage apparatus 100.

At the start of a read operation, the sense amplifier device 3 charges the bit line. The sense amplifier device 3 creates a "High" state and a "Low" state depending on whether or not the bit line is discharged. On the basis of this information, the sense amplifier device 3 determines bit information to perform a read operation.

In the read procedure, first, the read voltage is applied to the gate of each memory cell through the word line to determine whether the memory cell is to be turned on or to remain off (FIG. 1 I).

If the memory cell is to be turned on, the bit line is discharged to change to the "Low" state. Then, during a read operation, this state is sensed by the sense amplifier device 3, which thus stores the "Low" state (FIG. 1 II).

If the memory cell is to remain off, the bit line is not discharged and maintains the "High" state. Then, during the read operation, this state is sensed by the sense amplifier device 3, which thus stores the "High" state (FIG. 1 II).

On the basis of the stored "High" state or "Low" state, the sense amplifier device 3 forms data to determine bit information for each page (FIG. 1 III).

The sense amplifier device 3 then outputs the determined bit information via the data I/O buffer 5 (FIG. 1 IV).

As described above, with the procedures (I) to (III), the sense amplifier device 3 simultaneously performs a read operation on the plural memory cells along the columns which belong to one sector.

On the other hand, with the procedure (IV), an I/O bus to the data I/O buffer 5 has a given size (smaller than the page size).

Accordingly, a predetermined number of data outputs from the data I/O buffer allow all the data to be output. In other words, the number of data outputs depends on the page size.

The page size has recently tended to increase consistently with the amount of data read or written at a time during a single read or write operation.

Thus, the time required for a data output operation after a read operation (procedure IV) tends to be longer than the time required for a read voltage application operation (procedures I to III). For example, it is assumed that the time required to output 1 page of data is longer than that required for a single read voltage application operation.

With the bit assignment shown in FIG. 3, to read the first page, the bit information can be read by a single read voltage application operation. In this case, read data may be output while performing a read voltage application operation, in order to achieve a high-speed read operation. In this case, if the time required for the data output operation is longer than that required for a single read voltage application operation, the time required for a data output operation is longer than that required to read the first page several times. This disadvantageously prevents throughput from being improved.

On the other hand, with the bit assignment shown in FIG. 3, to read the third page, four read voltage application operations are performed to read the bit information. In this case, the time required to read the third page several times is longer than that required for a data output operation. This prevents a decrease in throughput associated with the time required for the data output operation.

The present embodiment thus averages the number of read voltage applications so as to prevent a decrease in throughput associated with the time required for the data output operation. Description will be given below of the assignment of bits to threshold voltages executed to average the number of read voltage applications (increase the number of read voltage applications to at least two for each page).

Figure 4:
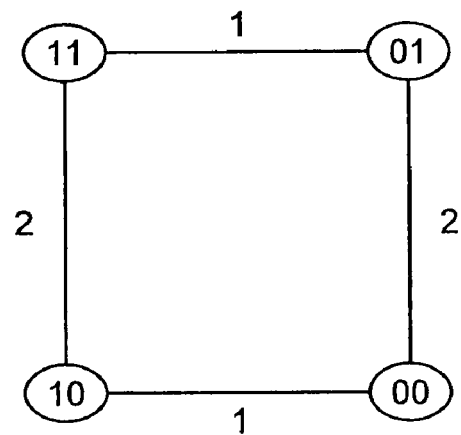
FIG. 4 is a graph showing that 2-bit information is assigned to each terminal and that the terminals are then joined together by lines.
Figure 5:
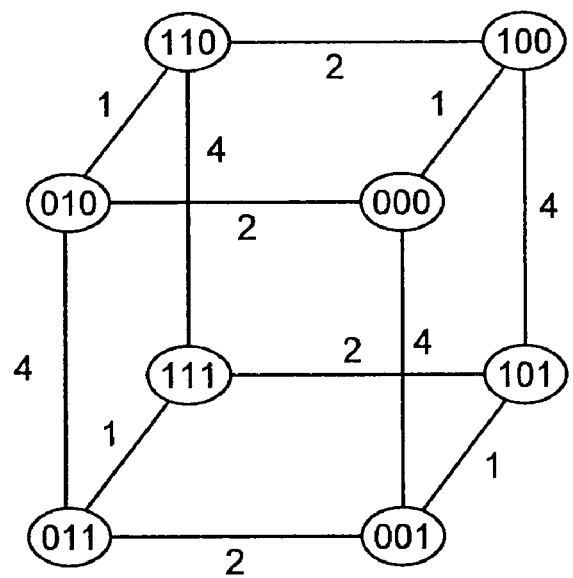
FIG. 5 is a graph showing that 3-bit information is assigned to each of the terminals, which are then joined together by lines.
Figure 6:
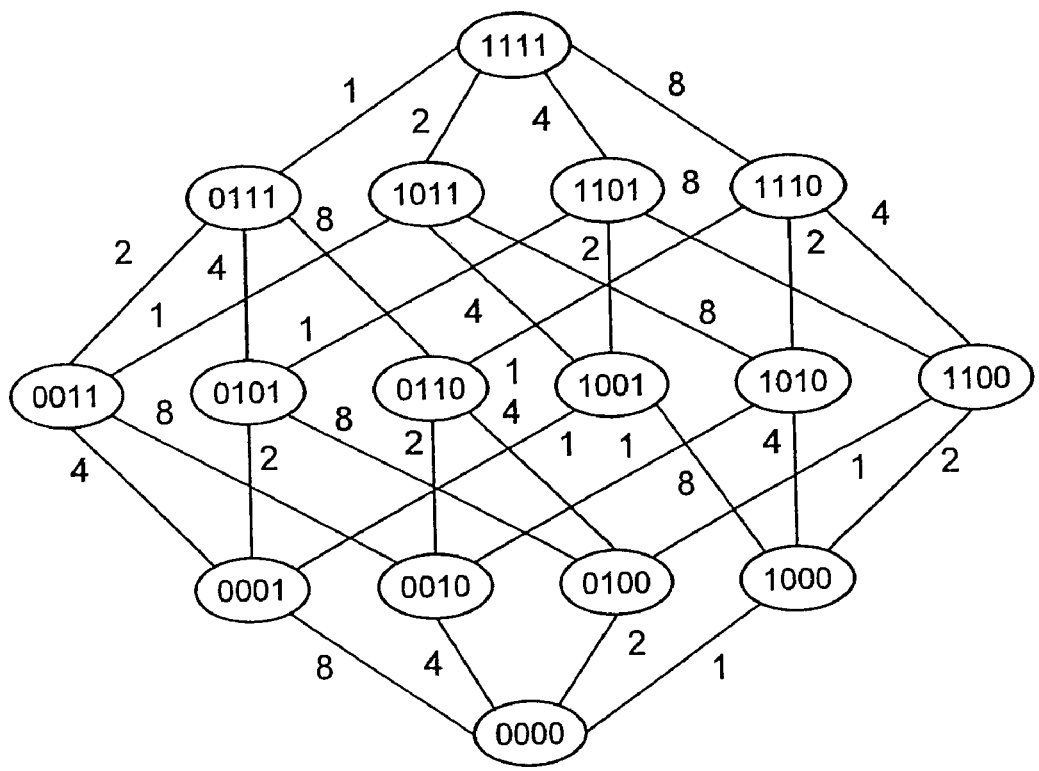
FIG. 6 is a graph showing that 4-bit information is assigned to each of the terminals, which are then joined together by lines.

FIG. 4 is a graph showing that 2-bit information is assigned to each terminal and that the terminals are then joined together by lines. FIG. 5 is a graph showing that 3-bit information is assigned to each of the terminals, which are then joined together by lines. FIG. 6 is a graph showing that 4-bit information is assigned to each of the terminals, which are then joined together by lines. Each terminal shows information of plural bits, and the pieces of information joined together by a side correspond to a set of data different from each other by 1 bit. The number on each side is a hexadecimal number indicating the difference in data between the terminals joined by the side.

FIGS. 7A to 7F show an example of the assignment of bits to threshold voltages executed when the memory cell stores 3-bit information according to Embodiment 1. FIGS. 8A to 8P show an example of the assignment of bits to threshold voltages executed when the memory cell stores 4-bit information according to Embodiment 1. In FIGS. 7A to 7F and 8A to 8P, bit information "0" and "1" is assigned to each page in association with the corresponding threshold voltage in a manner described below.

In the graphs shown in FIGS. 4 to 6, a path is ensured to exist which starts from an arbitrary terminal and which allows all the terminals to be searched for without passing through the same terminal twice. Accordingly, when x-bit information is assigned to each threshold voltage in this order, the assignment is executed on $2^x$ data so that there is a difference of only 1 bit between two pieces of the x-bit information (x is an integer equal to or larger than 2) corresponding to adjacent threshold voltages. That is, the x-bit information corresponding to certain threshold voltage differs from that corresponding to the adjacent threshold voltage by only 1 bit. $2^x-1$ read voltages are each set for a pair of adjacent threshold voltages. As already described, applying one of these read voltages to the corresponding word line determines the x-bit information stored in the corresponding memory cell 1a.

For example, as shown in FIG. 4, 2-bit information is stored in one memory cell. In this case, when adjacent threshold voltages are different from each other by only 1 bit, the following two manners of assignment are possible if the assignment starts with 11: {11, 10, 00, 11} and {11, 01, 00, 10}.

For 2 bits, it is impossible to set the number of read voltage application numbers to at least two for each page. However, if information of 3 or more bits (x is an integer equal to or larger than 3) is stored in the memory cell as described below, the number of read voltage application numbers can be set to at least two for each page.

As shown in FIG. 5, 3-bit information may be stored in one memory cell. In this case, 18 manners of assignment can be used to make bit information corresponding to certain threshold voltage different from that corresponding to the adjacent threshold voltage by only 1 bit.

In this case, as already described, for example, at least two read voltages need to be set so as not to reduce the throughput owing to the time required for a data output operation. Thus, to determine information for each of 3 bits, the number of read voltage application operations (number of read voltages) is set to be a combination of {2, 2, 3}.

For example, FIGS. 7A to 7F show 6 possible combinations of assignments {2, 2, 3} of bit information for the memory cell that can store 3-bit information.

Figure 7A:
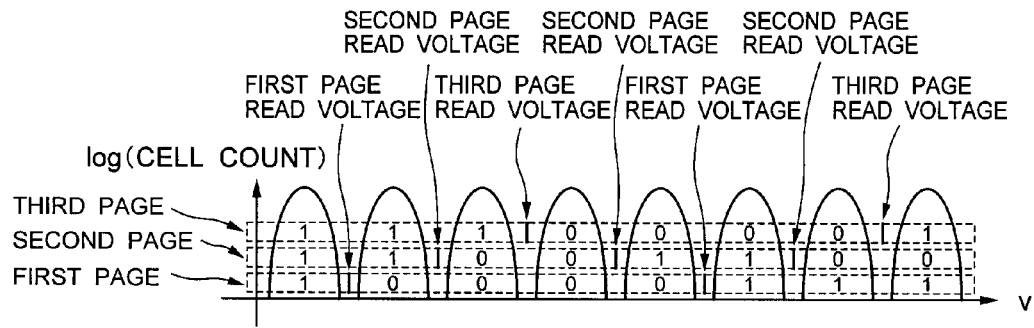
FIG. 7A is a diagram showing an example of the assignment of bits to threshold voltages executed when the memory cell stores 3-bit information according to Embodiment 1.
Figure 7B:
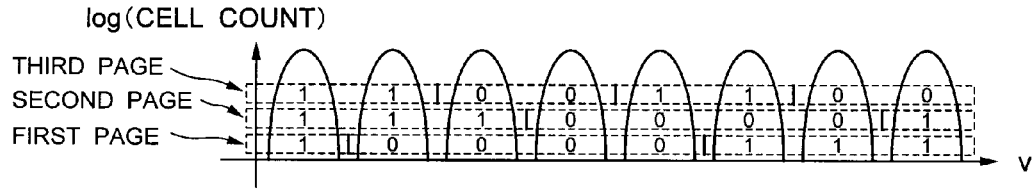
FIG. 7B is a diagram showing an example of the assignment of bits to threshold voltages executed when the memory cell stores 3-bit information according to Embodiment 1.
Figure 7C:
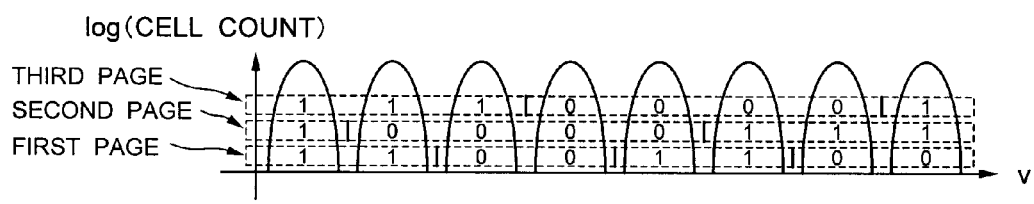
FIG. 7C is a diagram showing an example of the assignment of bits to threshold voltages executed when the memory cell stores 3-bit information according to Embodiment 1.
Figure 7D:
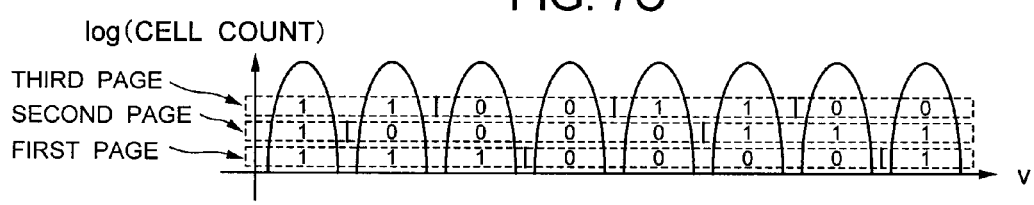
FIG. 7D is a diagram showing an example of the assignment of bits to threshold voltages executed when the memory cell stores 3-bit information according to Embodiment 1.
Figure 7E:
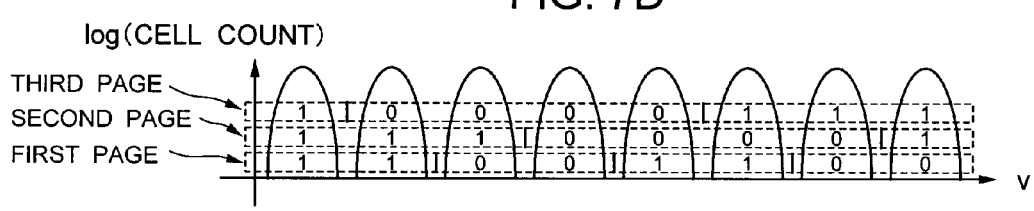
FIG. 7E is a diagram showing an example of the assignment of bits to threshold voltages executed when the memory cell stores 3-bit information according to Embodiment 1.
Figure 7F:
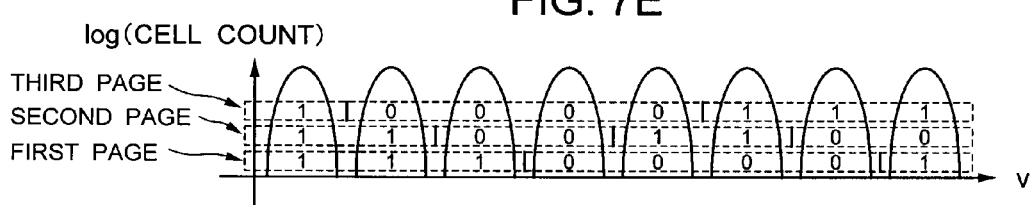
FIG. 7F is a diagram showing an example of the assignment of bits to threshold voltages executed when the memory cell stores 3-bit information according to Embodiment 1.
Figure 8A:
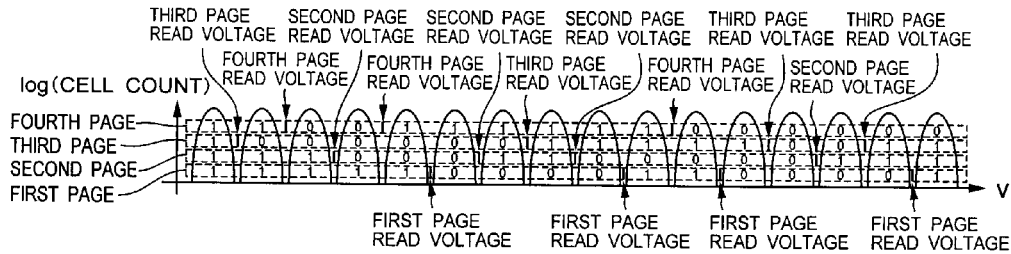
FIG. 8A is a diagram showing an example of the assignment of bits to threshold voltages executed when the memory cell stores 4-bit information according to Embodiment 1.
Figure 8B:
FIG. 8B is a diagram showing an example of the assignment of bits to threshold voltages executed when the memory cell stores 4-bit information according to Embodiment 1.
Figure 8C:
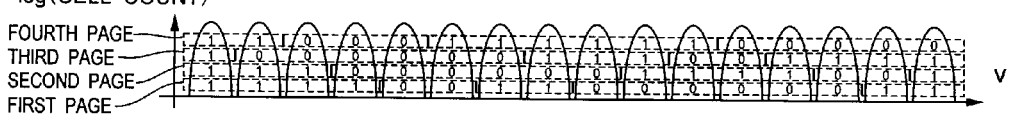
FIG. 8C is a diagram showing an example of the assignment of bits to threshold voltages executed when the memory cell stores 4-bit information according to Embodiment 1.
Figure 8D:
FIG. 8D is a diagram showing an example of the assignment of bits to threshold voltages executed when the memory cell stores 4-bit information according to Embodiment 1.
Figure 8E:
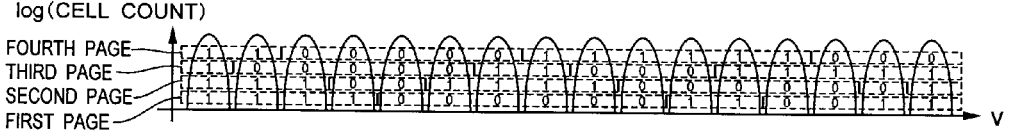
FIG. 8E is a diagram showing an example of the assignment of bits to threshold voltages executed when the memory cell stores 4-bit information according to Embodiment 1.
Figure 8F:
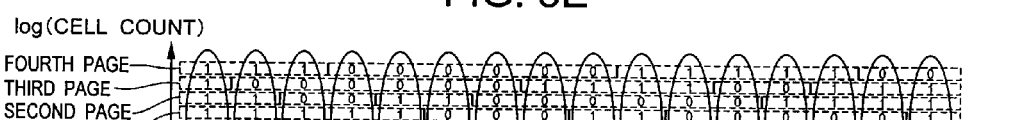
FIG. 8F is a diagram showing an example of the assignment of bits to threshold voltages executed when the memory cell stores 4-bit information according to Embodiment 1.
Figure 8G:
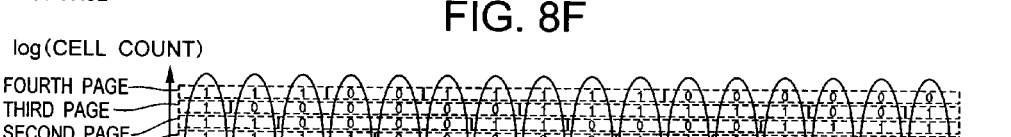
FIG. 8G is a diagram showing an example of the assignment of bits to threshold voltages executed when the memory cell stores 4-bit information according to Embodiment 1.
Figure 8H:
FIG. 8H is a diagram showing an example of the assignment of bits to threshold voltages executed when the memory cell stores 4-bit information according to Embodiment 1.
Figure 8I:
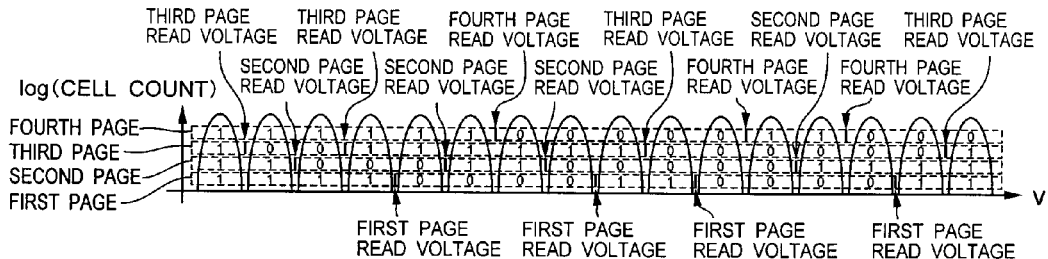
FIG. 8I is a diagram showing an example of the assignment of bits to threshold voltages executed when the memory cell stores 4-bit information according to Embodiment 1.
Figure 8J:
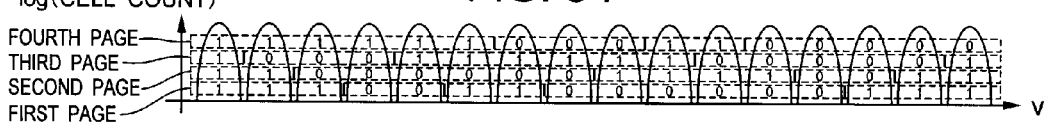
FIG. 8J is a diagram showing an example of the assignment of bits to threshold voltages executed when the memory cell stores 4-bit information according to Embodiment 1.
Figure 8K:
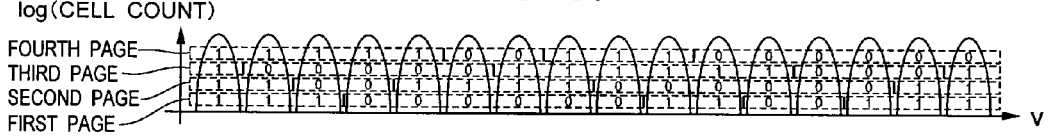
FIG. 8K is a diagram showing an example of the assignment of bits to threshold voltages executed when the memory cell stores 4-bit information according to Embodiment 1.
Figure 8L:
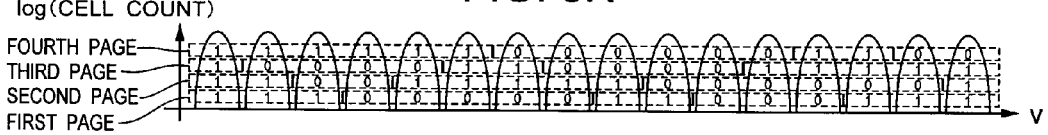
FIG. 8L is a diagram showing an example of the assignment of bits to threshold voltages executed when the memory cell stores 4-bit information according to Embodiment 1.
Figure 8M:
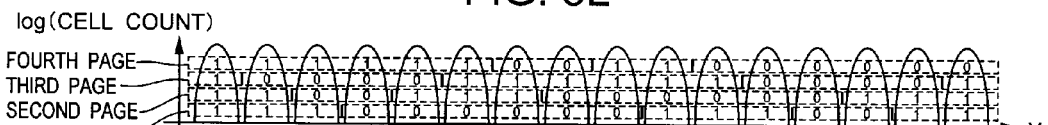
FIG. 8M is a diagram showing an example of the assignment of bits to threshold voltages executed when the memory cell stores 4-bit information according to Embodiment 1.
Figure 8N:
FIG. 8N is a diagram showing an example of the assignment of bits to threshold voltages executed when the memory cell stores 4-bit information according to Embodiment 1.
Figure 8O:
FIG. 8O is a diagram showing an example of the assignment of bits to threshold voltages executed when the memory cell stores 4-bit information according to Embodiment 1.
Figure 8P:
FIG. 8P is a diagram showing an example of the assignment of bits to threshold voltages executed when the memory cell stores 4-bit information according to Embodiment 1.

For example, in FIG. 7B, to read the data stored in the first page, the row decoder 2 applies a 2-position read voltage to the word lines. Each of the memory cells is turned on or off on the basis of the relationship between the threshold voltage and read voltage of the memory cell. The states of the bit lines are determined on the basis of states of the memory cells. As already described, on the basis of the states of the bit lines, the sense amplifier circuit 3a determines the bit information corresponding to the first and sixth to eighth threshold voltages in order of increasing voltage to be "1". The sense amplifier circuit 3a determines the bit information corresponding to the second and fifth threshold voltages in order of increasing voltage to be "0". To read the data stored in the second page, the row decoder 2 applies a 2-position read voltage to the word lines. Each of the memory cells is turned on or off on the basis of the relationship between the threshold voltage and read voltage of the memory cell. The states of the bit lines are determined on the basis of states of the memory cells. As already described, on the basis of the states of the bit lines, the sense amplifier circuit 3a determines the bit information corresponding to the first to third and eighth threshold voltages in order of increasing voltage to be "1". The sense amplifier circuit 3a determines the bit information corresponding to the fourth to seventh threshold voltages in order of increasing voltage to be "0". To read the data stored in the third page, the row decoder 2 applies a 3-position read voltage to the word lines. Each of the memory cells is turned on or off on the basis of the relationship between the threshold voltage and read voltage of the memory cell. The states of the bit lines are determined on the basis of states of the memory cells. As already described, on the basis of the states of the bit lines, the sense amplifier circuit 3a determines the bit information corresponding to the first, second, fifth, and sixth threshold voltages in order of increasing voltage to be "1". The sense amplifier circuit 3a determines the bit information corresponding to the third, fourth, seventh, and eighth threshold voltages in order of increasing voltage to be "0".

Further, as shown in FIG. 6, 4-bit information may be stored in one memory cell. In this case, if bit information corresponding to a certain threshold voltage is different from that corresponding to the adjacent threshold voltage by only 1 bit, 5,712 manners of assignment are possible.

As is the case with 3 bits, for example, at least two read voltage need to be set (the number of read voltage application is set to at least two for each page) so as to prevent the throughput from being hindered by the time required for a data output operation. Thus, to determine information for each of 4 bits, the number of read voltage application operations is set to be one of the combination of {2, 2, 3, 8}, {2, 2, 4, 7}, {2, 2, 5, 6}, {2, 3, 3, 7}, {2, 3, 4, 6}, {2, 3, 5, 5}, {2, 4, 4, 5}, {3, 4, 4, 4}, and {3, 3, 4, 5}.

For example, there are 16 possible combinations of assignments {3, 4, 4, 4} of bit information for the memory cell that can store 4-bit information as shown in FIGS. 8A to 8P. A method for reading data stored in each page is similar to that used for 3 bits as described above.

As described above, when bit information is assigned to the memory in which x-bit information can be stored in each memory cell, at least two read voltages are set to determine information for the bit corresponding to each page of the x bits.

Now, the assignment of the bits to the threshold values for the memory cell according to the present embodiment will be compared to the conventional assignment of the bits to the threshold voltages for the memory cell from the view point of error rate.

For example, if the bits are assigned to the threshold voltages as shown in FIG. 7B and as shown in FIG. 3, a factor such as a manufacturing variation may cause the threshold voltage of a certain memory cell to be garbled into the threshold voltage of the adjacent threshold voltage, which may thus be read.

In this case, in FIG. 7B for the present embodiment, for each page, adjacent threshold voltages are present at seven positions. Two pieces of bit information corresponding to adjacent threshold voltages differ by only 1 bit at two positions for the first page, at two positions for the second page, and at three positions for the third page. Therefore, the error rate for each page is such that for the seven positions each involving adjacent threshold voltages, the ratio of the error positions for the first page to the error positions for the second page to the error positions for the third page is 2:2:3.

In FIG. 3 for the conventional example, for each page, adjacent threshold voltages are similarly present at seven positions. Two pieces of bit information corresponding to adjacent threshold voltages differ by only 1 bit at one position for the first page, at two positions for the second page, and at four positions for the third page. Therefore, the error rate for each page is such that for the seven positions each involving adjacent threshold voltages, the ratio of the error positions for the first page to the error positions for the second page to the error positions for the third page is 1:2:4.

When error corrections are executed in terms of pages, if the error rate is different at any position, the correction ability needs to be determined with respect to the position with the highest error rate.

In the conventional example of data assignment shown in FIG. 3, two pieces of bit information corresponding to adjacent thresholds differ by only 1 bit. However, if error corrections are executed in terms of pages, the error rate needs to adjust to the third page for which adjacent pieces of bit information differ at four positions.

In contrast, for example, in the present embodiment shown in FIG. 7B, the error rate may adjust to the third page for which adjacent pieces of bit information differ at three positions. Therefore, the error correction ability may be three-fourths of that in the conventional example shown in FIG. 3.

Accordingly, if 3-bit information is stored in the memory cell, then to determine information for each of the 3 bits, the number of read voltage application operations is set to be a combination of {2, 2, 3}. In other words, there is a difference of 1 between the maximum and minimum values of the number of read voltage application operations set to determine information each of the 3 bits.

Further, if 4-bit information is stored in the memory cell, then to determine information for each of the 4 bits, the number of read voltage application operations is set to be a combination of {3, 4, 4, 4}. In other words, there is a difference of 1 between the maximum and minimum values of the number of read voltage application operations set to determine information each of the 4 bits.

If there is thus a difference of 1 between the maximum and minimum values of the number of read voltage application operations set to determine information each of x bits, a lower error correction ability can be set, enabling an increase in the operation speed of the nonvolatile semiconductor storage apparatus 100.

Figure 9:
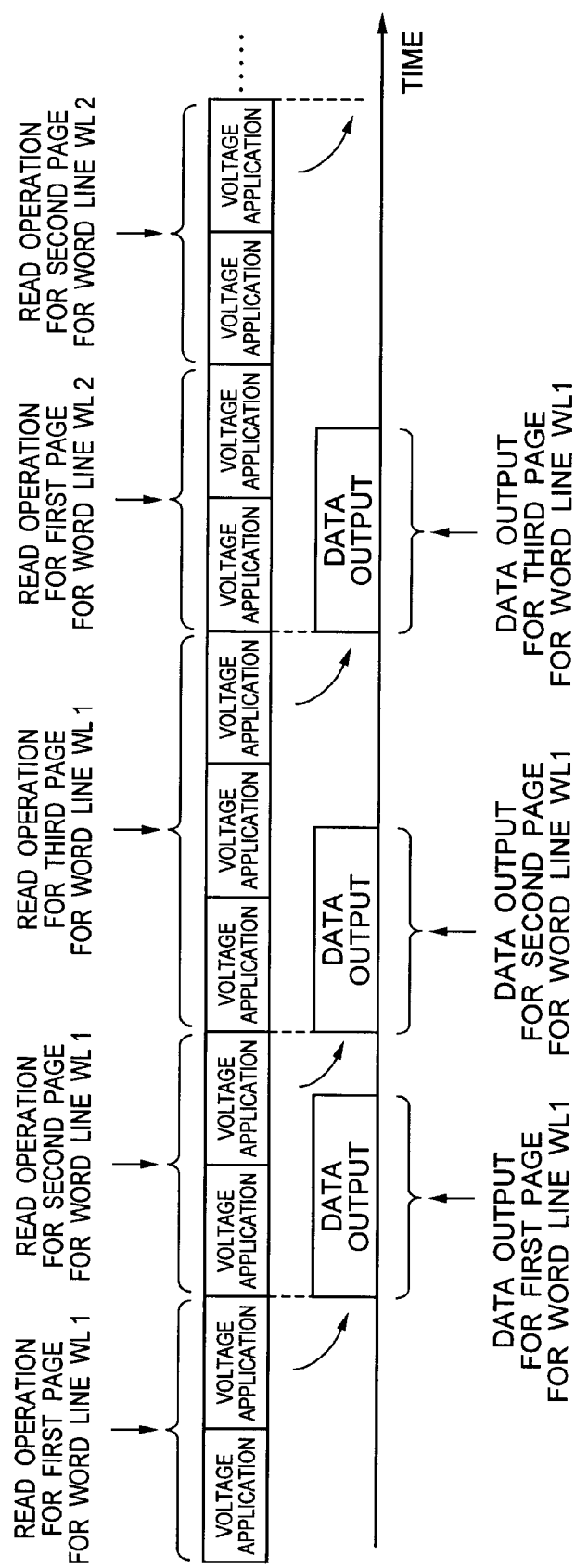
FIG. 9 is a diagram illustrating the concept of a data output operation according to Embodiment 1 in which the memory cell stores 3-bit information.

FIG. 9 is a diagram illustrating the concept of a data output operation according to Embodiment 1 in which the memory cell stores 3-bit information. As already described, in FIG. 9, to determine information for each of the 3 bits, the number of read voltage application operations is set to be a combination of {2, 3, 3}.

Even if the time required for a data output operation is longer than that required for a single read voltage application operation as shown in FIG. 9, data output efficiency can be improved by averaging the number of read operations for parallel data outputs. In this case, the read voltage application operation has only to be considered for the data output time.

As described above, the nonvolatile semiconductor storage apparatus according to the present embodiment enables an increase in data output speed.

In the embodiments, if the number of pieces of bit information that can be stored in one page differs for any memory cells, a different command may be used to read information from these memory cells.

Further, in the description of the embodiments, 3- or 4-bit information is stored in the memory cell. However, the present invention is also applicable if 5 or more-bit information is stored in the memory cell.

What is claimed is:

1. A nonvolatile semiconductor storage apparatus comprising:
   a memory cell array having a plurality of memory cells which are connected to word lines and to bit lines and in each of which different information of x (x is an integer equal to or larger than 3) bits is stored in association with $2^x$ threshold voltages, the x-bit information being able to be read from each memory cell by applying a read voltage to the corresponding word line;
   a row decoder connected to the word lines to supply voltages to the word lines to operate the memory cells; and
   a sense amplifier device connected to the bit lines to read data stored in the memory cells and to hold the read data and data written to the memory cells,
   wherein the x-bit information corresponding to a certain threshold voltage differs from that corresponding to the adjacent threshold voltage by only 1 bit,
   $2^x-1$ of the read voltages are each set for a pair of adjacent threshold voltages, and applying any of the read voltages to the word line determines the x-bit information stored in the memory cell, and
   at least two read voltages are set in order to determine information for each of the x bits.

2. The nonvolatile semiconductor storage apparatus according to claim 1, wherein there is a difference of 1 between a maximum value and a minimum value of the number of read voltage application operations set to determine the information for each of the x bits.

3. The nonvolatile semiconductor storage apparatus according to claim 2, wherein the x-bit information is 3-bit information, and to determine the information for each of the 3 bits, the number of read voltage application operations is set to be a combination {2, 2, 3}.

4. The nonvolatile semiconductor storage apparatus according to claim 2, wherein the x-bit information is 4-bit information, and to determine the information for each of the 4 bits, the number of read voltage application operations is set to be a combination {3, 4, 4, 4}.

5. The nonvolatile semiconductor storage apparatus according to claim 1, wherein the x-bit information is 4-bit information, and to determine the information for each of the 4 bits, the number of read voltage application operations is set to be one of combinations {2, 2, 3, 8}, {2, 2, 4, 7}, {2, 2, 5, 6}, {2, 3, 3, 7}, {2, 3, 4, 6}, {2, 3, 5, 5}, {2, 4, 4, 5}, {3, 4, 4, 4}, and {3, 3, 4, 5}.

6. The nonvolatile semiconductor storage apparatus according to claim 1, wherein the nonvolatile semiconductor storage apparatus is a NAND type flash memory.

7. The nonvolatile semiconductor storage apparatus according to claim 2, wherein the nonvolatile semiconductor storage apparatus is a NAND type flash memory.

8. The nonvolatile semiconductor storage apparatus according to claim 3, wherein the nonvolatile semiconductor storage apparatus is a NAND type flash memory.

9. The nonvolatile semiconductor storage apparatus according to claim 4, wherein the nonvolatile semiconductor storage apparatus is a NAND type flash memory.

10. The nonvolatile semiconductor storage apparatus according to claim 5, wherein the nonvolatile semiconductor storage apparatus is a NAND type flash memory.

* * * * *